United States Patent [19]

Mickelsen et al.

[11] Patent Number: 4,523,051

[45] Date of Patent: Jun. 11, 1985

[54] THIN FILMS OF MIXED METAL COMPOUNDS

[75] Inventors: Reid A. Mickelsen, Bellevue; Wen S. Chen, Seattle, both of Wash.

[73] Assignee: The Boeing Company, Seattle, Wash.

[21] Appl. No.: 536,395

[22] Filed: Sep. 27, 1983

[51] Int. Cl.$^3$ .................... H01L 31/06; H01L 31/18
[52] U.S. Cl. .................... 136/260; 136/258; 136/264; 136/265; 29/572; 357/11; 357/16; 357/30; 427/74; 427/76; 427/87; 427/255.2; 148/174; 148/175
[58] Field of Search .............. 136/258 PC, 260, 264, 136/265; 357/11, 16, 30, 59, 61; 29/572; 427/74, 76, 87, 255.2; 148/174, 175

[56] References Cited

U.S. PATENT DOCUMENTS

| | | | |
|---|---|---|---|
| 2,938,816 | 5/1960 | Gunther | 427/87 |
| 3,341,360 | 9/1967 | Nickl | 156/609 |
| 3,380,841 | 4/1966 | Beintema | 427/255.1 |
| 3,531,335 | 9/1970 | Heyerdahl et al. | 148/174 |
| 3,615,931 | 10/1971 | Arthur | 148/175 |
| 3,673,011 | 6/1972 | Strull | 148/175 |
| 3,765,960 | 10/1973 | Boss et al. | 148/175 |
| 3,839,084 | 10/1974 | Cho et al. | 156/611 |
| 3,888,705 | 6/1975 | Fletcher et al. | 148/175 |
| 3,900,363 | 8/1975 | Teraoka et al. | 156/612 |
| 4,046,565 | 9/1977 | Miller | 430/57 |
| 4,058,430 | 11/1977 | Suntola et al. | 156/611 |
| 4,063,974 | 12/1977 | Fraas | 148/175 |
| 4,239,584 | 12/1980 | Chang et al. | 156/612 |
| 4,325,986 | 4/1982 | Baron et al. | 427/74 |
| 4,327,119 | 4/1982 | Lis et al. | 427/74 |
| 4,335,266 | 6/1982 | Mickelsen et al. | 136/260 |

OTHER PUBLICATIONS

R. A. Mickelson and W. S. Chen, "Polycrystalline Thin-Film CuInSe$_2$ Solar Cells," *Proc. Sixteenth IEEE Photovoltaic Specialists Conf.*, 1982, pp. 781–785.

F. Abou-elfotouh and A. S. Abdelhalim, "Studies on Silicon-based CdS and ZnS Hybrid Stystems for the Utility of These Films in Solar Cells," *J. Vac. Sci. Technol.*, vol. 21, No. 2, Jul./Aug. 1982, pp. 681–683.

E. T. Prince, et al., "Summary Abstract: Preparation of Polycrystalline Thin Films of Cu$_2$S from Thin Films of Copper in H$_2$S: H$_2$ Gas Mixtures," *J. Vac. Sci. Technol.*, vol. 20, No. 3, Mar. 1982, pp. 415–416.

L. L. Kazmerski, et al., "Auger Electron Spectroscopy Studies of I–III–VI$_2$ Chalcopyrite Compounds," *J. Vac. Sci. Technol.*, vol. 15, No. 2, Mar./Apr. 1978, pp. 249–253.

L. L. Kazmerski and P. Sheldon, "Fabrication and Characterization of ITO/CuInSe$_2$ Photovoltaic Heterojunctions," *Proc. Thirteenth IEEE Photovoltaic Specialists Conf.*, 1978, pp. 541–544.

L. L. Kazmerski et al., "The Performance of Copper-Ternary Based Thin-Film Solar Cells," *Proc. Thirteenth IEEE Photovoltaic Specialists Conf.*, 1978, pp. 184–189.

L. L. Kazmerski and G. A. Sanborn, "CuInS$_2$ Thin-Film Homojunction Solar Cells," *J. Appl. Phys.*, vol. 48, No. 7, Jul. 1977, pp. 3178–3180.

L. L. Kazmerski, et al., "Growth and Characterization of Thin-Film Compound Semiconductor Photovoltaic Heterojunctions," *J. Vac. Sci. Technol.*, vol. 14, No. 1, Jan./Feb. 1977, pp. 65–68.

L. L. Kazmerski et al., "Thin-Film CuInSe$_2$/CdS Heterojunction Solar Cells," *Appl. Phys. Lett.*, vol. 29, No. 4, Aug. 1976, pp. 268–270.

L. L. Kazmerski, "Ternary Compound Thin Film Solar Cells," Final Report, Grant No. AER 75-19576, National Science Foundation/Dept. of Elec. Eng.—University of Maine at Orono., Oct. 1976.

L. L. Kazmerski et al., "Growth and Properties of Vacuum Deposited CuInSe$_2$ Thin Films," *J. Vac. Sci. Technol.*, vol. 13, No. 1, Jan./Feb. 1976, pp. 139–144.

J. L. Shay et al., "Heterojunction Band Discontinuities," *Appl. Phys. Lett.*, vol. 28, No. 1, Jan. 1976, pp. 31–33.

L. L. Kazmerski, et al., "CuInS$_2$ Thin Films: Preparation and Properties," *J. Appl. Phys.*, vol. 46, No. 11, Nov. 1975, pp. 4865–4869.

T. L. Hench et al, "Thin Film (CdZn)S for Solar Cells", *Proceedings 2nd E.C. Photovoltaic Solar Energy Conf.* (1979), Reidel (Dordrecht), pp. 379–386.

R. B. Hall et al, "10% Conversion Efficiency in Thin Film Polycrystalline (CdZn)S/Cu$_2$S Solar Cells", *Conf. Record, 15th IEEE Photovoltaic Specialists Conf.* (1981), pp. 777–779.

*Primary Examiner*—Aaron Weisstuch

*Attorney, Agent, or Firm*—Finnegan, Henderson, Farabow, Garrett & Dunner

[57] ABSTRACT

A compositionally uniform thin film of a mixed metal compound is formed by simultaneously evaporating a first metal compound and a second metal compound from independent sources. The mean free path between the vapor particles is reduced by a gas and the mixed vapors are deposited uniformly. The invention finds particular utility in forming thin film heterojunction solar cells.

18 Claims, 5 Drawing Figures

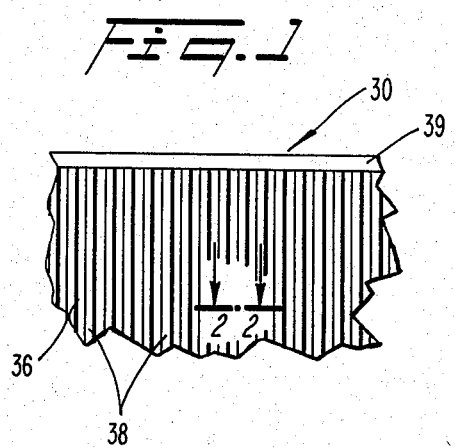
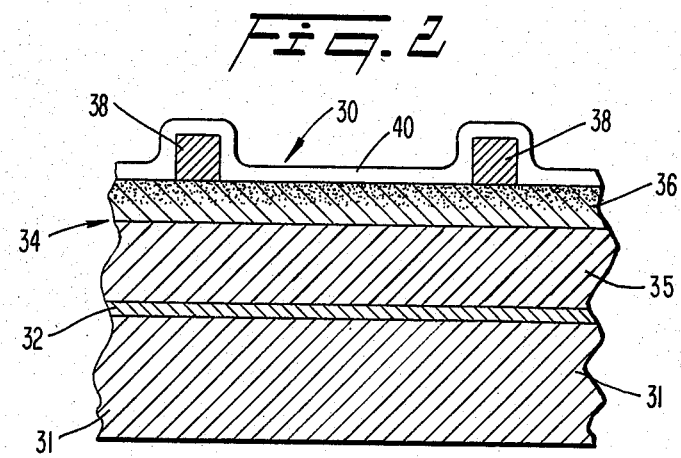
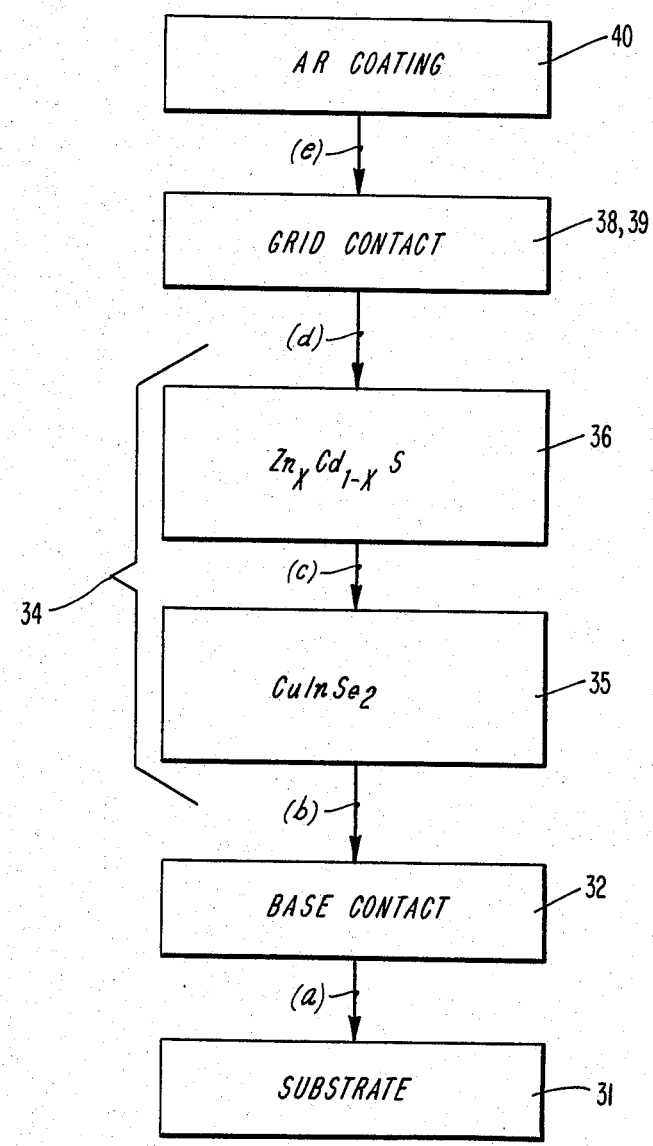

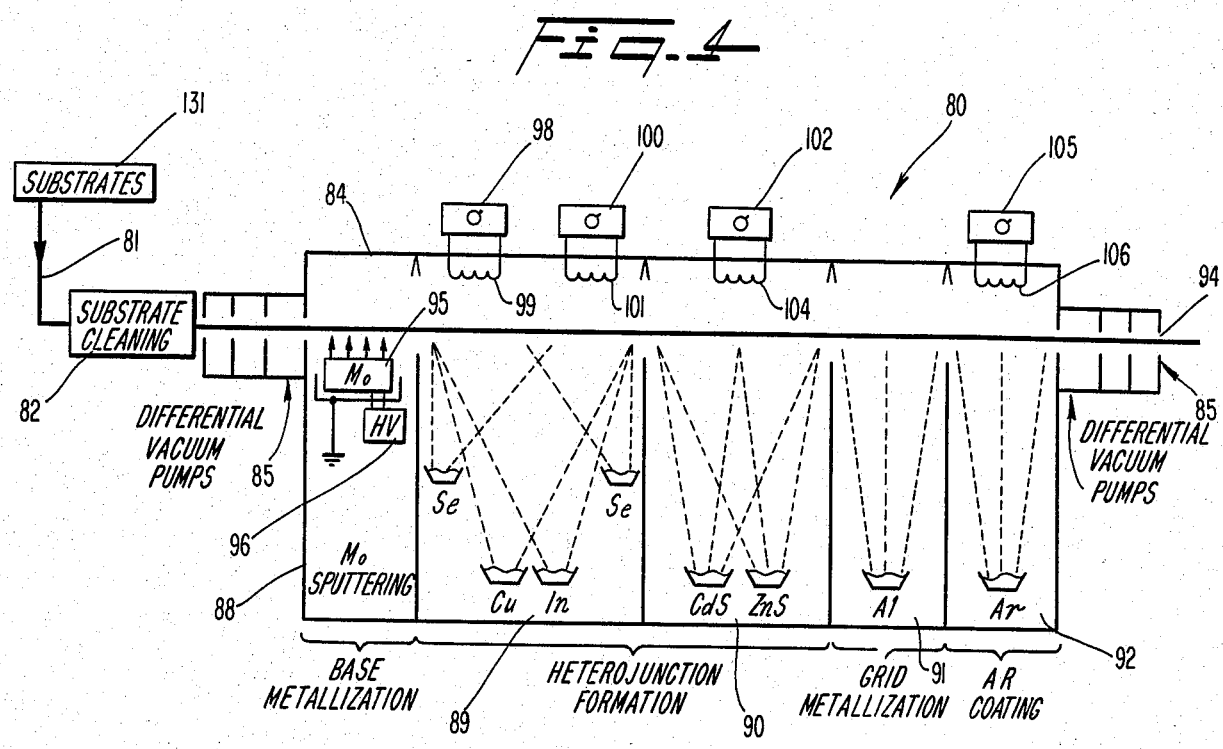
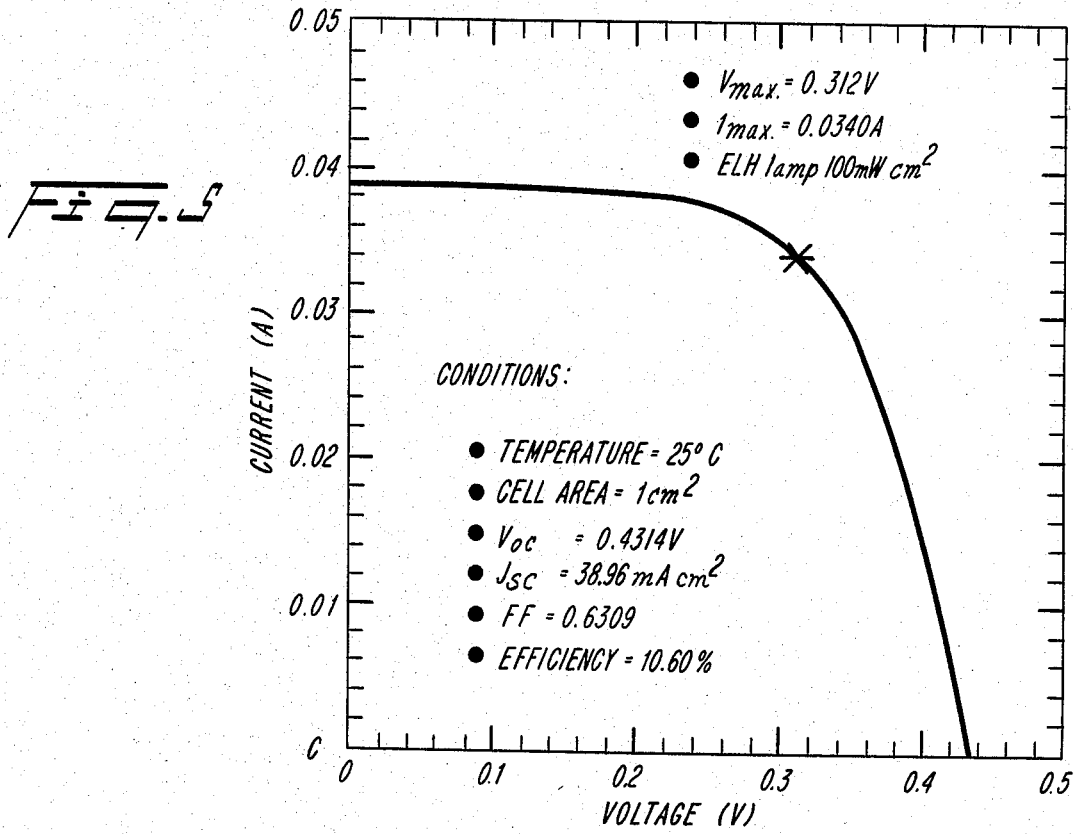
PHOTOVOLTAIC CHARACTERISTICS OF AN AR-COATED $CuInSe_2/ZnCdS$ CELL

THIN FILMS OF MIXED METAL COMPOUNDS

The Government of the United States of America has rights in this invention pursuant to Contract No. EG-77-C-01-4042, Subcontract No. XJ-9-8021-1, awarded by the U.S. Department of Energy.

FIELD OF THE INVENTION

The present invention relates to thin films of mixed metal compounds useful as components in thin film solar cells and methods of making such films.

BACKGROUND OF THE INVENTION

The search for alternative means of producing electrical energy has created significant interest in the formation of semiconductor devices that are capable of being economically manufactured and that can convert solar energy to electrical energy. Such devices should effectively collect incident light, efficiently convert the light energy to electrical energy and the devices should be capable of being produced at a low unit cost.

Prior efforts in development of such devices has generally been directed to two different forms of semiconductor material. The first is a single crystal material that is doped to produce a semiconductor solar cell. Such cells are relatively efficient, exhibiting efficiencies of approximately 14–16%; however, they are difficult to economically manufacture on a large scale because they rely on the casting of high purity single crystals. While the technology exists to manufacture solar cells of such a type, the batch casting process and the difficulties in maintaining purity of such castings makes such a process inherently difficult and uneconomic.

A second type of material is produced in a different way to form thin polycrystalline films of semiconducting materials which in turn may form a heterojunction solar energy transducer. The method of making this second type of device comprises the present invention.

Such devices are well known and have been the subject of numerous publications. U.S. Pat. No. 4,335,266 to Mickelsen and Chen discloses and claims such a device. Generally, it discloses means for adjusting the copper/indium ratio in the chalcopyrite portion of a CdS/CuInSe$_2$ heterojunction and the articles made by the disclosed technique. That patent also describes and cites a number of references that disclose the general state of the art in this technology.

The previous Mickelsen and Chen patent discloses a method of making both semiconductor layers of a heterojunction device. The present invention is, however, directed primarily to a method for forming one portion of a layered semiconductor device, e.g., the n-type $Zn_xCd_{1-x}S$ portion of a $Zn_xCd_{1-x}S/CuInSe_2$ n-p heterojunction cell. The invention also includes articles made by the unique forming technique.

Previous attempts to form mixed metal compound films such as $Zn_xCd_{1-x}S$ resulted in unacceptably high film resistances, especially at Zn contents of in excess of 15%. In order to reduce the resistivity of the film, the temperature of the vapor source was increased but this in turn affected the deposition rate, film composition, and the chamber pressure. In such a technique, the two separate vapors were generated in different portions of a multicomponent vapor source and then mixed prior to introduction to the deposition process by means of a common orifice. The vapor source was heated to a single temperature and the rate of vapor production of the individual vapors was controlled primarily by the orifice sizes of the various portions of the vapor source.

The shortcomings of such a technique were eliminated by practice of the present invention, which provides a relatively inexpensive method of making a mixed metal compound in the form of a thin film having properties much improved over previous processes. Specifically, the present invention provides a means for economically producing a mixed metal compound heterojunction solar cell having excellent conversion efficiencies.

SUMMARY OF THE INVENTION

The method embodiment of the present invention comprises a method of forming a uniform thin film of a polycrystalline mixed metal compound on a substrate. The method includes the step of introducing a vapor of a first metal compound to a vessel containing the substrate from a first vapor source while simultaneously introducing a vapor of a second metal compound from a second vapor source to the vessel. The first and second metals are the metal components of the mixed metal compound (e.g., Zn and Cd in a $Zn_xCd_{1-x}S$ compound). The vaporization rate of the two vapor sources are indepentently controlled. The mean free path between vapor particles in the vessel is reduced by introducing a sufficient amount of a gas to induce homogeneity of the vapor mixture. The homogeneous vapor mixture is deposited on the substrate. Preferably, the substrate is a I-III-VI$_2$ chalcopyrite material and the mixed metal compound is $Zn_xCd_{1-x}S$. It is further preferred that the gas used to promote homogeneity is hydrogen.

By practice of the present invention there is produced a mixed metal compound of controlled, uniform composition finding particular utility as a portion of a layered heterojunction solar cell. Other advantages and objects of the invention will be set out below or will be obvious from the description or may be learned by practice of the disclosed embodiments of the invention.

BRIEF DESCRIPTION OF THE DRAWINGS

FIG. 1 is a diagrammatic plan view of a portion of a conventional thin film solar cell, as well as one embodying the present invention.

FIG. 2 is a cross-sectional view of the solar cell of FIG. 1 showing the various components of a solar cell.

FIG. 3 is a schematic block diagram of the method of the present invention.

FIG. 4 is a schematic depiction of an apparatus disposed to carry out the method of the present invention.

FIG. 5 is a graphic representation of the photovoltaic characteristics of a solar cell made according to the invention.

DETAILED DESCRIPTION OF THE PREFERRED EMBODIMENTS

FIGS. 1 and 2 depict a fragmentary portion of a thin-film p-n-type heterojunction solar cell, generally indicated as 30.

Dependent upon the particular end results desired, the thicknesses of the various layers of the cell 30 may vary somewhat. In general, thin-layer heterojunction cells of the type described herein commonly have an overall thickness (excluding the thickness of the substrate material, which may be on the order of approximately 0.025") ranging from about 5 $\mu$m to about 10 $\mu$m. Such thin-film cells are to be contrasted with conventional single crystal, silicon-type solar cells and concentrator solar cells wherein the thickness of the active portions of the cell may range from 200 μm to 400 μm.

The exemplary cell depicted in FIGS. 1 and 2 is representative of both thin-film cells embodying the features of the present invention and cells formed of similar materials, but made in accordance with known processes.

The active layers of the cell are deposited on a suitable substrate 31, which is here preferably formed of polycrystalline aluminum oxide ($Al_2O_3$) having a thickness on the order of 0.025″. Other materials may also be used including, for example, glazed alumina, glass, enameled steel, metal foils, and similar inert inorganic materials, provided only that the material selected is capable of withstanding the process temperatures involved, which range up to about 500° C. In addition, the substrate should not interact with the deposited active layers of cell and should also have a coefficient of thermal expansion compatible with the active layer.

As depicted in FIG. 2, a suitable base contact 32 is applied directly to one surface of the substrate 31. Excellent results are obtained using molybdenum, but other materials could also be used. For example, a molybdenum/gold combination could be used, or other materials such as nickel or graphite which have been commonly employed in conventional solar cells may also be used for the base contact.

The essence of any light-to-electrical energy transducer, lies in the photoactive semiconductor materials defining the junction, generally indicated at 34 in FIG. 2. The junction may comprise a p-n-type junction or n-p-type junction of either the homojunction variety (wherein the junction is formed by impurity diffusion or implantation into one surface of the photoactive semiconductor material), or of the heterojunction variety (wherein the junction is defined at the interface between two different semiconductor materials, one of which is an n-type material and the other of which is a p-type material).

The present invention relates to a heterojunction device having first and second respectively different semiconductor layers 35, 36. The present invention includes n-p-type heterojunction devices, particularly in the case of non-solar cell applications and having band gap energies of greater than 1.5 ev; however, the embodiment disclosed herein is a p-n-type heterojunction suitable for use as a solar cell having a relatively narrow band gap energy ranging from about 1 to 1.5 ev. This embodiment has a first semiconductor layer 35 formed of p-type material and a second semiconductor layer 36 formed of n-type material.

A wide range of photovoltaic materials have been used to form the semiconductor portion of a solar cell. Ternary chalcopyrite compounds, and especially those of the I-III-VI$_2$ type, have shown particular promise, see U.S. Pat. No. 4,335,266. In addition, the concept of varying the ratio of I-III components in this portion of the device, as is disclosed in detail in the noted patent, is fully applicable to the present invention. Specifically, varying the Cu/In ratio duright deposition of a CuInSe$_2$ semiconductor layer to affect its electrical properties is preferred.

A number of different materials may be used as the semiconductor layer 35 including $CuGaSe_2$, $CuInS_2$, $CuInSe_2$ and $CuInTe_2$. Such materials all have band gaps near the optimum value of terrestrial solar energy conversion. They are direct band gap semiconductors which minimize the requirement for long minority carrier diffusion lengths. Except for $CuGaSe_2$, which has only exhibited p-type behavior, the other three ternary compounds may be formed as either n- type or p-type crystals. Thus, constructions of homojunction devices is possible. These chalcopyrite compounds can also be paired with $Zn_xCd_{1-x}S$ to potentially make efficient p-n-type heterojunction solar cells because they have compatible lattice structures with acceptable lattice mismatches, and favorable differences of electron affinities. When used in applications other than solar cells, other I-III-VI$_2$ compounds may be employed such as, for example: $AgInS_2$; $AgGaSe_2$; $AgGaTe_2$; $AgInSe_2$; $CuGaTe_2$; $AgInTe_2$; and $CuGaS_2$.

As will be discussed in detail below, a particular method of making a thin film solar cell based on ternary compounds selected from the class of I-III-VI$_2$ chalcopyrite compounds has been developed. Such a method has been used with notable success with layered heterojunction devices employing such compounds in one layer and a mixed metal compound such as $Zn_xCd_{1-x}S$ in a second layer. Such devices have shown exceptional conversion efficiencies.

The exemplary cell 30 depicted in FIGS. 1 and 2 further includes a suitable grid contact pattern which is deposited on the upper surface of the semiconductor layer 36 defining a portion of the junction 34. In the embodiment depicted, the contact grid comprises a plurality of generally parallel, fine-line electrodes 38 which are electrically connected to a suitable current collecting electrode 39 (FIG. 1) which is here illustrated as being adjacent to the edge of the photoactive region of the cell.

The grid-type electrodes 38, 39 may be formed of various materials but should have high electrical conductivity and form a good ohmic contact with the underlying semiconductor layer 36. Excellent results have been attained utilizing vacuum deposited aluminum which exhibits the requisite conductivity characteristics and has excellent ohmic contact when the underlying semiconductor layer comprises $Zn_xCd_{1-x}S$ or the like. However, other materials might be used to provide the ohmic contact such as indium, chromium, or molybdenum with a conductive metal such as copper, silver, nickel or the like placed over the material forming the ohmic contact.

To improve the light collection efficiencies of the solar cell 30, the laminated thin-film device herein described is conventionally provided with an anti-reflective coating. As here embodied, the device includes anti-reflective coating 40. While the particular material used to form the anti-reflective coating 40 is not critical to the present invention, excellent results have been attained when using $SiO_x$—a suboxide of silicon wherein "x" varies between 1 and 2 dependent upon the deposition parameters employed. Particularly excellent results have been achieved when the value of "x" is on the order of about 1.8. Other materials can be utilized including, for example, silica, aluminum oxide, tantalum oxide, etc., although preferably the anti-reflective coating will be selected from a material having a refraction index of about 1.55.

FIG. 3 illustrates in block-diagram form a typical process for forming a thin-film heterojunction device utilizing a ternary chalcopyrite material for one semiconductor layer, with the two layers defining a heterojunction. In step (a) a suitable base contact 32 is applied to substrate 31 in any of the well known conventional manners such, for example, as by RF-Sputtering techniques, vacuum deposition, or the like. Thereafter, the first semiconductor layer 35, which is here shown as a ternary chalcopyrite compound and, more particularly, as CuInSe$_2$, is applied to the base contact 32 during step (b), generally by vacuum deposition techniques.

Following application of the first semiconductor layer 35, the second semiconductor layer 36, which is here shown for illustrative purposes to be Zn$_x$Cd$_{1-x}$S, is preferably vacuum deposited in step (c) on the first semiconductor layer 35. It is the manner in which the mixed metal compound is uniformly formed as a thin film in the form of a polycrystalline layer that comprises the present invention. This process step is set out in detail below. The two layers 35, 36 define a heterojunction 34. Thereafter, the grid contact arrangement 38, 39 is applied to the surface of the upper semiconductor layer 36 during step (d); conventionally, by means of through-mask evaporation techniques. Finally, an anti-reflective coating 40 is applied to the upper surface of the solar cell over the grid contact pattern and the exposed portions of the semiconductor layer 36 during step (e).

In carrying out the present invention, the uppermost semiconductor layer 36 in the exemplary device is an n-type layer and, perferably, an n-type Zn$_x$Cd$_{1-x}$S semiconductor layer. Desirably, this layer 36 is a low resistivity layer; and, to achieve this desired result, the Zn$_x$Cd$_{1-x}$S layer 36 is vacuum deposited on the first semiconductor layer 35 in a carefully controlled process wherein Zn$_x$Cd$_{1-x}$S is deposited during step (c) to a depth preferably on the order of about 3 μm.

Because the components of the mixed metal compound issue from vapor sources that are independently controlled (as will be described below). The composition of the n-type layer can be conveniently controlled and need not be uniform throughout its thickness. It is preferred in the embodiment disclosed that the initial layer of Zn$_x$Cd$_{1-x}$S that forms the actual junction have a somewhat higher Zn content while the remainder of the layer have a lower Zn content to reduce the resistivity and facilitate doping. In such an embodiment it is preferred that there be a first high Zn region ranging in thickness from about 0.5 μm to about 1.5 μm, and a superimposed low Zn region ranging in thickness from about 2.0 μm to 4.0 μm.

The grid contacts 38, 39 were applied on top of the Zn$_x$Cd$_{1-x}$S semiconductor layer 36 utilizing conventional throughmetal mask techniques and an evaporation system employing an electron gun source for aluminum deposition. The grid lines or electrodes 38 are preferably on the order of about 2.0 μm in thickness and are extremely fine electrode lines ranging in width from about 25 μm to 50 μm. The exemplary laboratory solar cells were formed utilizing grid lines of approximately 25 μm in width with ten equally spaced parallel lines per centimeter, defining a transparent grid structure exposing from 93% to 95% of the underlying semiconductor layer 36. Finally, an SiO$_x$ antireflective coating (where "x" is equal to approximately 1.8) was applied by vacuum evaporation at temperatures ranging from 100° C. to 125° C.

Referring now to FIG. 4, there has been illustrated an exemplary system for forming solar cell heterojunctions embodying the features of the present invention. As here shown, the system employs a continuous in-line system of the type generally indicated diagrammatically at 80. In this type of system, substrates 131 are continuously fed along a suitable conveyor system, indicated diagrammatically at 81, through a substrate cleaning station 82. As the substrates exit the cleaning station 82, they enter a continuous in-line vacuum chamber 84 having differential vacuum pumps generally indicated at 85 and sequentially presented process areas 88-92, with the substrates ultimately exiting from the vacuum chamber 84 at 94.

Process area 88 comprises a vacuum chamber preferably controlled at temperatures and pressure conditions, suitable for application of a molybdenum or similar base contact material to the substrate by conventional sputtering or vacuum deposition techniques. In the exemplary system 80 of FIG. 4, the Mo contact is applied by using a Mo target 95 coupled to a suitable high voltage source 96 in a conventional manner.

Process area 89 is preferably maintained at a temperature on the order of at least 350° and ranging to 450° by means of an adjustable temperature control 98 and heating coil 99 so as to permit vacuum deposition of CuInSe$_2$ on the substrates as they transit through vacuum chamber 84. A second adjustable heat control 100 and heating coil 101 may be provided at the downstream end of zone 89 for raising the substrate temperature to about 450° C. ±25° C., but less than 500° C., after about 75% of the CuInSe$_2$ layer has been deposited. The pressure in area 89 of chamber 84 is preferably maintained at about 3–8×10$^{-6}$ torr.

As the substrates successively pass through process areas 90, 91 and 92, the low resistivity Zn$_x$Cd$_{1-x}$S (or other suitable II-VI materials having band gap energies greater than 1.5 ev) semiconductor layer 36, aluminum contact grid 38, 39, and SiO$_x$ layer 40 are sequentially applied thereto. In another embodiment of the invention process area 90 may include, in addition to the CdS and ZnS sources, an indium source (not shown) to facilitate doping of the Zn$_x$Cd$_{1-x}$S layer. A temperature control 102 and heating coil 104 are provided for establishing a controlled temperature level in process area 90 ranging from about 150° C. to about 250° C.; while a similar adjustable control 105 and coil 106 are provided in process area 92 for maintaining the temperature in a range of about 100° C. to about 125° C. Aluminum is preferably evaporated in process area 91 at ambient temperature and at a a pressure less than 5×10$^{-6}$ torr; while CdS and ZnS are preferably evaporated in process area 90 in its presence of hydrogen at a pressure in the range of from 1 to 3×10$^{-4}$ torr. Finally, an SiO$_x$ anti-reflective coating is deposited in process area 92.

The present invention permits the formation of both p-n-type heterojunctions and n-p-type heterojunctions which are formed by a process in which, preferably, a I-III-VI$_2$ type photoactive material is deposited by simultaneous elemental evaporation to initially form a first semiconductor layer. The invention is not limited to ternary type materials and other materials may also be suitable. For example, a quaternary material such as CuIn$_{1-x}$Ga$_x$Se$_2$ or CuIn$_{1-x}$Ga$_x$S$_2$ may be used. The compound from which the photoactive region of the cell is formed should have at least three constituent elements including at least two elements selected from the class of I-III elements such, for example, as copper and indium, and at least one element selected from a class VI material such as Se or S. Similarly, while excellent results have been obtained utilizing Zn$_x$Cd$_{1-x}$S as the n-type material, a material having a band gap energy of greater than 2.4 ev, other materials could be used such, for example, as CdS$_{1-x}$Se$_x$ or Zn$_x$Cd$_{1-x}$Se. Thus, it is evident that the n-type material is preferably selected from the class of II-VI elements having suitable wide gap energies greater than 1.5 ev.

As noted above, the present invention resides in the manner of forming a particular layer of a mixed metal compound, a preferred embodiment of which is a p-n type solar cell. The invention comprises a method for forming a uniform thin film of a polycrystalline mixed metal compound on a substrate. Such a method finds particular utility in forming semiconductor devices such as thin film solar cells.

The formation of thin films of mixed metal compounds by evaporation techniques has, in the past, been accomplished with only moderate success. The resistivity of the films produced and the reproduceability of the film were problems. The present invention overcomes such problems by introducing a vapor of a first metal compound into the vessel containing the substrate to be coated while simultaneously introducing a vapor of a second metal compound into the vessel from a second vapor source. The two metals introduced to the vessel comprise the metals of the mixed metal compound and preferably have a common electronegative element. For example, the invention has been used to produce uniform thin films of $Zn_xCd_{1-x}S$ in connection with the production of improved solar cells. The invention is, however, broader than a method of producing semiconductor materials for solar cells. One skilled in the art may find numerous applications for such a technique wholly separate from the preferred embodiment disclosed herein.

The introduction of two vaporized metal compounds from separate sources is, by itself, not sufficient to provide the benefits of the invention. This feature does, however, provide a relatively simple means of controlling the rate of evaporation from the separate vapor sources. Independent vapor sources normally would produce compositional variations in the layers produced; however, the present invention includes a step that renders the deposited layer of mixed metal compound uniform in composition.

In accordance with the invention, the method includes the step of reducing the mean free path between vapor particles in the vessel by introducing an effective amount of a gas to the vessel. The collisions between vapor particles and the gas within the vessel promote mixing of the materials within the vessel and thereby nullify the effect of introducing compound vapors at different rates from separate sources. While conventional vacuum techniques can be used, such techniques should accommodate the presence of the gas used to reduce the mean free path of the vapor particles. For the embodiment disclosed in FIG. 4 the vacuum chamber should contain hydrogen at a pressure in the range of from 1 to $3 \times 10^{-4}$ torr.

The disclosed method was used to produce a number of $Zn_xCd_{1-x}S/CuInSe_2$ heterojunction solar cells where the $Zn_xCd_{1-x}S$ portion had a Zn content of approximately 20%. It is generally preferred that the Zn content be in the range of from 10 to 30% and for the combination of $Zn_xCd_{1-x}S/CuInSe_2$ the theoretically preferred range is 15–17% because in that range the mismatch in lattice parameters and electron affinities are minimized. The forgoing percentages are atomic percents.

A 1 cm$^2$ cell (including an anti-reflective silica coating) was tested with an ELH lamp having an intensity of 100 mW/um$^2$ (calibrated to a NASA standard silicon cell) and exhibited an open circuit voltage as high as 430 mV. As shown in FIG. 5, the efficiency of such cells was about 10.6%, which is presently the highest known efficiency reported for a thin film solar cell. The spectral response of the cell indicates that its quantum efficiency is quite uniform at values over 0.8 in the wavelength range of from 600 nm. to 900 nm.

It should be understood that the invention has been illustrated in terms of a preferred embodiment and the scope of the invention should not be limited thereto. The embodiment disclosed finds particular utility as a heterojunction solar cell exhibiting high open circuit voltage, high efficiency, high quantum yields and high photocurrents. Such structures are resistant to degradation and capable of being manufactured at relatively low unit costs. One skilled in the art may, however find other applications for the invention. Such applications may be considered to be within the claims of the present application or equivalent to that claimed.

What is claimed is:

1. A method for forming a uniform composition thin film of a polycrystalline mixed metal compound on a substrate, said method consisting essentially of the steps of:
   (a) introducing a vapor of a first metal compound to a vessel containing said substrate from a first vapor source while simultaneously introducing a vapor of a second metal compound from a second vapor source to said vessel to form a vapor mixture comprised of metal compounds, said first and second metals comprising the metal components of said mixed metal compound;
   (b) independently controlling the vaporization rate of said first and second vapor sources;
   (c) reducing the mean free path between vapor particles of said mixture in said vessel by including a gas within said vessel, said gas being present in an amount sufficient to induce homogeneity of said vapor mixture; and
   (d) depositing said homogeneous vapor mixture on said substrate to form a uniform composition polycrystalline film of said first and second metal compounds thereon.

2. The method of claim 1 wherein said first metal is an element from Group IIB of the Periodic Table.

3. The method of claim 1 wherein said second metal is an element from Group IIB of the Periodic Table.

4. The method of claim 1 wherein said substrate is a I-III-VI$_2$ chalcopyrite material.

5. The method of claim 1 wherein said mixed metal compound is a sulfide.

6. The method of claim 5 wherein said gas is hydrogen.

7. The method of claim 6 wherein hydrogen in said vessel is present in an amount to provide a pressure in the range of from $1-3 \times 10^{-4}$ torr.

8. A method of making a thin film heterojunction solar cell according to the method of claim 5 wherein said mixed metal compound is $Zn_xCd_{1-x}S$ and said compound is about 20% Zn, said substrate being CuInSe$_2$.

9. The method of claim 1 wherein said mixed metal compound is $Zn_xCd_{1-x}S$, wherein said mixture contains from 10 to 30% Zn.

10. A method of making a thin film heterojunction solar cell comprised of a substrate of a I-III-VI$_2$ chalcopyrite having a thin film of a uniform composition mixed metal compound deposited thereon, said method consisting essentially of the steps of:

(a) introducing a vapor of a first metal compound to a vessel from a first vapor source while simultaneously introducing a vapor of a second metal compound from a second vapor source to said vessel thereby forming a vapor comprised of said first metal compound and said second metal compound, said first and second metals comprising the mixed metal compound; having a common electronegative element;

(b) independently controlling the vaporization rate of said first and second vapor sources; and (c) reducing the mean free path between vapor particle in said vessel by including a gas within said vessel, said gas being present in an amount sufficient to induce homogeneity of said vapor mixture and thereby produce a uniform composition thin film of a polycrystalline mixed metal compound comprised of said first and second metals and said common electronegative element on said substrate.

11. The method of claim 10 wherein said gas is hydrogen in an amount sufficiently to provide a pressure in said vessel of from $1-3\times10^{-4}$ torr.

12. The method of claim 10 wherein said mixed metal compound is $Zn_xCd_{1-x}S$ and Zn comprises from 10 to 30% of said mixed metal compound.

13. The method of claim 12 wherein said mixed metal compound is $Zn_xCd_{1-x}S$ and Zn comprises about 20% of said mixed metal compound.

14. A thin film heterojunction solar cell, said heterojunction comprising a p-type $I-III-IV_2$ chalcopyrite substrate and an overlying layer of an n-type ternary mixed metal compound wherein said ternary mixed metal compound is applied to said substrate by introducing the vapor of a first metal compound to a vessel containing said substrate from a first vapor source while simultaneously introducing a vapor of a second metal compound from a second vapor source of said vessel, said first and second metals comprising the metal components of said mixed metal compound; independently controlling the vaporization rate of said first and second vapor sources; reducing the mean free path between vapor particles in said vessel, said gas being present in an amount sufficient to induce homogeneity of said vapor mixture; and depositing said mixed metal compound on said substrate in the form of a uniform composition polycrystalline mixed metal compound.

15. The solar cell of claim 14 wherein said mixed metal compound is $Zn_xCd_{1-x}S$ and said compound is from 10 to 30% Zn.

16. The solar cell of claim 15 wherein said $Zn_xCd_{1-x}S$ is about 20% Zn.

17. The solar cell of claim 15 wherein said substrate is $CuInSe_2$.

18. The solar cell of claim 17 wherein the ratio of Cu to In is adjusted during deposition of said substrate of $CuInSe_2$ such that the ratio of Cu to In is not uniform within said substrate upon its formation.

* * * * *